(12) United States Patent
Chiriku et al.

(10) Patent No.: US 6,605,780 B2
(45) Date of Patent: Aug. 12, 2003

(54) CONNECTION BOX

(75) Inventors: Akihiko Chiriku, Shizuoka-ken (JP); Norio Ito, Shizuoka-ken (JP); Hiroyuki Sasaki, Shizuoka-ken (JP); Yoshiyuki Takahara, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/132,261

(22) Filed: Apr. 26, 2002

(65) Prior Publication Data

US 2002/0166690 A1 Nov. 14, 2002

(30) Foreign Application Priority Data

Apr. 27, 2001 (JP) .................................. P 2001-133327

(51) Int. Cl.[7] ................................................ H02G 3/18
(52) U.S. Cl. ........................ 174/60; 174/60; 174/59; 361/683; 361/406; 361/395; 361/413; 333/12; 439/79; 363/21; 363/16; 363/20; 363/98; 363/132; 323/235; 323/319
(58) Field of Search ................. 174/59, 60; 361/683, 361/406, 395, 413; 333/12; 439/79; 363/21, 16, 20, 98, 132; 323/235, 319

(56) References Cited

U.S. PATENT DOCUMENTS

| | | | | | |
|---|---|---|---|---|---|
| 5,822,189 | A | * | 10/1998 | Isshiki | 174/59 |
| 5,920,034 | A | * | 7/1999 | Saka et al. | 174/59 |
| 6,043,431 | A | * | 3/2000 | Kato | 174/54 |
| 6,213,788 | B1 | * | 4/2001 | Murakami | 439/76.2 |

OTHER PUBLICATIONS

U.S. Patent Application No. 10/131,081 by Akihiko Chiriku et al., filed on Apr. 25, 2002.

* cited by examiner

*Primary Examiner*—Dean A. Reichard
*Assistant Examiner*—Anton Harris
(74) *Attorney, Agent, or Firm*—Finnegan, Henderson, Farabow, Garrett & Dunner, L.L.P.

(57) ABSTRACT

A connection box includes a wiring board. The box includes a control board connected to the wiring board. The control board including a control device and another device separated thereinto. Another device has generation heat greater than the control device.

11 Claims, 12 Drawing Sheets

CONNECTION BOX

BACKGROUND OF THE INVENTION

The present invention relates to a connection box which collectively connects and distributes wire-harness in the case that wire harness is arranged in a vehicle.

The connection box is substantially formed by piling a single-layered or a multi-layered circuit board in which bus bar and electric wires are arranged so as to constitute a desired circuit, on a plane wiring board, and by covering the board by an upper cover and an lower cover. A control board constituting an electronic control portion is mounted on the board mentioned above. The control base board has an insulating board, and electronic parts such as a resistor, a coil, a relay, a fuse and the like are provided thereon. The control base board is connected to a predetermined circuit of the board.

The board is received between the upper cover and the lower cover so as to constituted a module. The upper cover is mounted to a relay or a fuse, which is provided outward.

SUMMARY OF THE INVENTION

In the connection box mentioned above, however, the control base board has a power portion having a great amount of calorific power such as a relay, a resistor, a coil or the like, and a control portion constituted by a control device being weak against a heat and having a small amount of calorific power, and they are mixed.

Accordingly, in the connection box, there is a case that the electronic parts and the control devices are arranged close to each other. Due to this arrangement, there is a possibility that a heat generated from the electronic parts directly apply a bad influence to the control device.

Mixing of the electronic parts and the control device is achieved by connecting them by setting the power portion to a main body on the basis of a large circuit pattern. This mixture increases an area of the control base board and enlarges a size of the connection box.

There is a possibility that the heat generated in the relay of the upper cover directly affects the control device, by receiving the board in the upper cover or the lower cover.

The present invention proposes a connection box, which effectively insulates a heat generated in a power portion of a control base board from a control portion. The connection box achieves a compact size of the control base board. The connection box effectively insulates the heat of the electronic parts in the module from the control portion.

In view of an aspect, the invention provides a connection box. The box includes a wiring board. The box includes a control board connected to the wiring board. The control board includes a control device and another device separated thereinto. Another device has generation heat greater than the control device.

Preferably, the control device and another device are connected to each other by a narrow print wiring.

Preferably, the control device and another device have a partition therebetween for thermally insulating the control device from said another device.

Preferably, the connection box further includes a cover housing the control board and including a port on outside thereof for mounting a device. The cover includes a wall between the control device and the port.

BRIEF DESCRIPTION OF THE ACCOMPANYING DRAWINGS

DETAILED DESCRIPTION OF THE PREFERRED EMBODIMENTS

A description will be in detail given below of an embodiment according to the present invention with reference to the accompanying drawings.

Figure 1:
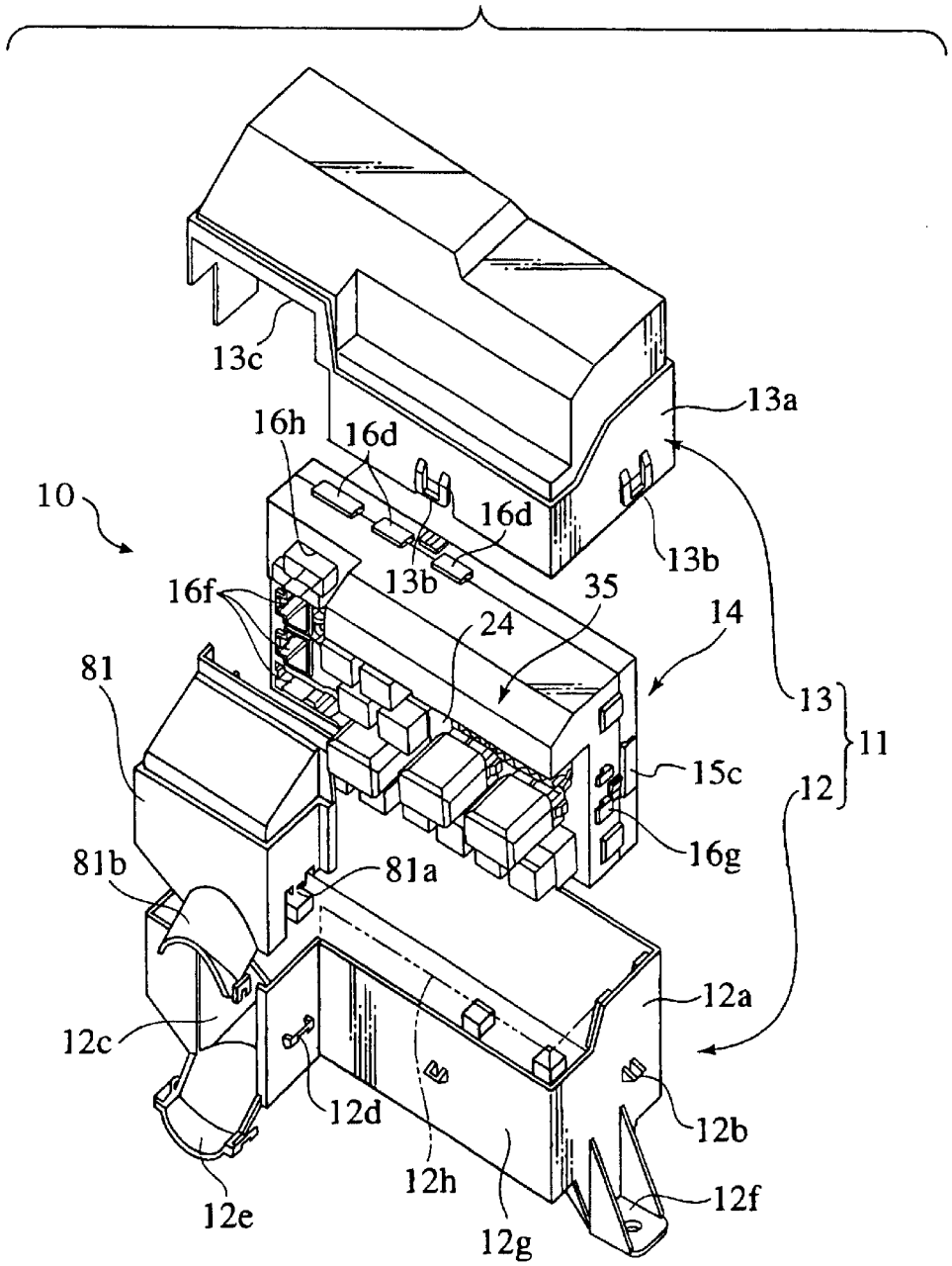
FIG. 1 is an exploded perspective view showing a whole of a connection box.

In a connection box 10 according to the present embodiment, as shown in FIG. 1, a module 14 is received between a lower case 12 and an upper case 13 in a case 11. In this state, the connection box 10 is mounted to an engine room or the like of a vehicle. In the connection box 10, a base board 44 of a control base board 19 mentioned below which is assembled in the module 14 is arranged so as to be respectively separated into a power portion P and a control portion C in a lump.

Figure 2:
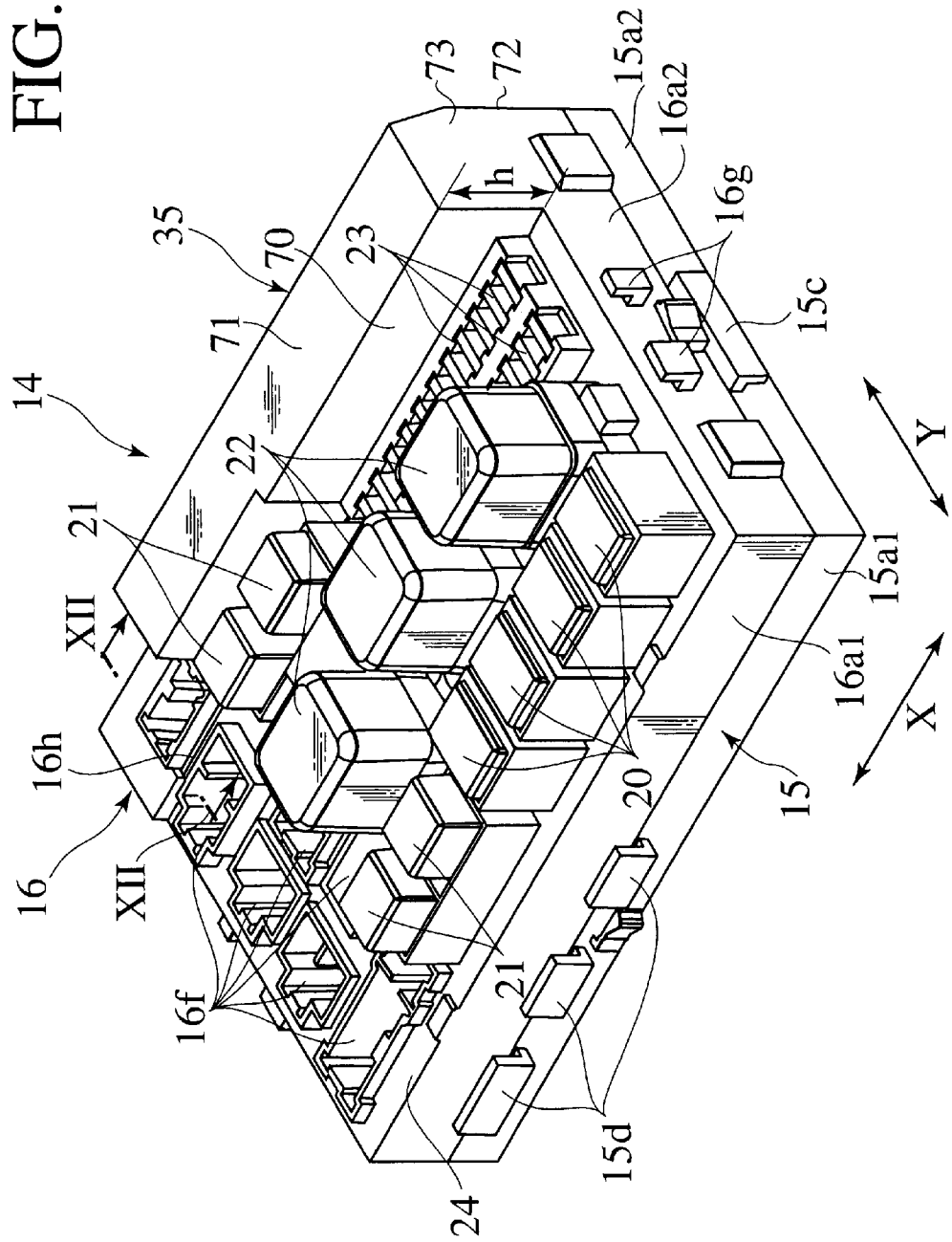
FIG. 2 is a perspective view of a module.
Figure 3:
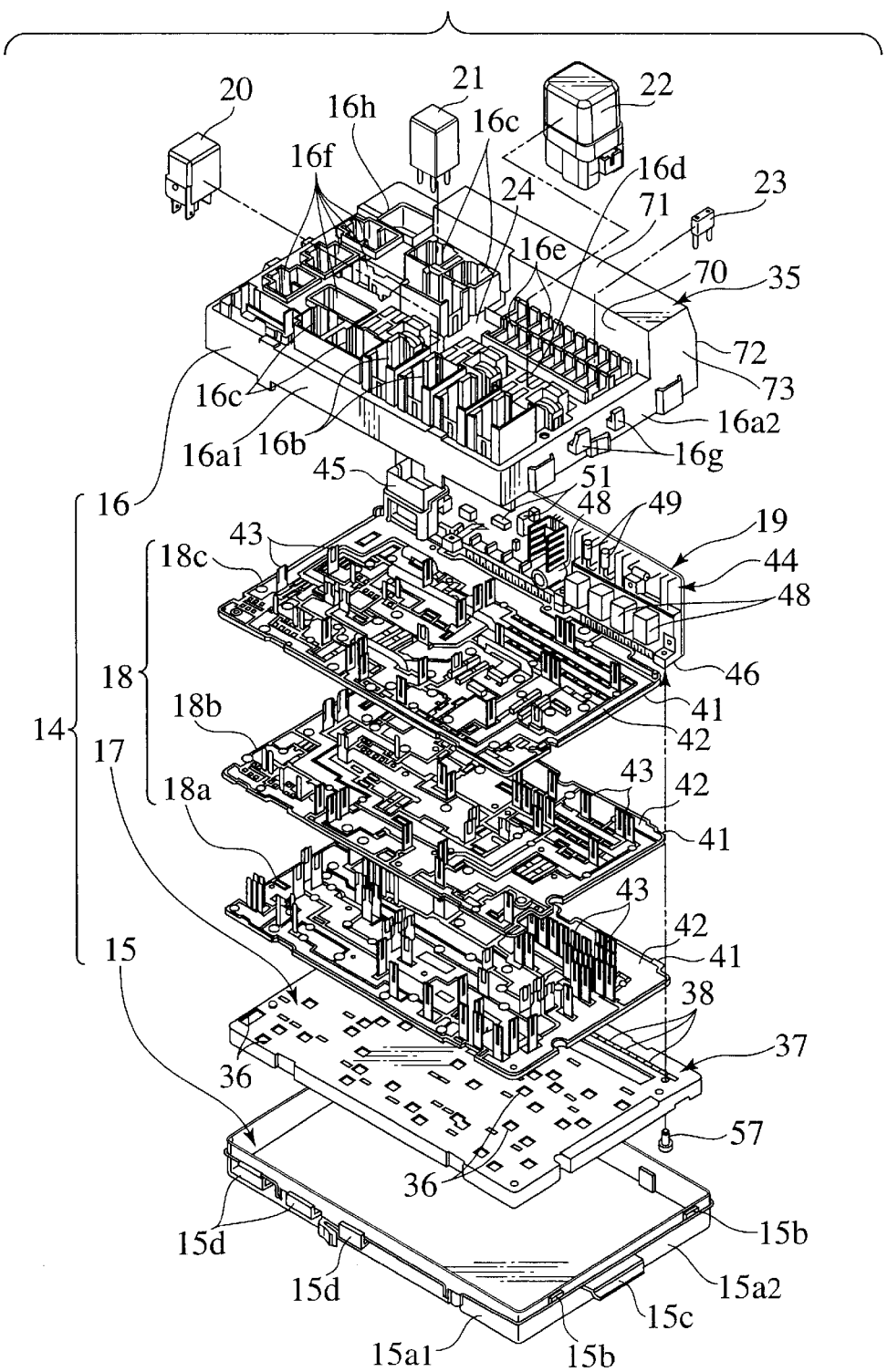
FIG. 3 is an exploded perspective view of the module.

Module 14, in FIGS. 2 and 3, receives between an upper cover 15 and a lower cover 16, a plane wiring board 17, a wiring board piled in multi-step, and a control board 19. Side walls 16a1, 16a2 around the upper cover 11 are fitted removably to outer surfaces of upper end portions in side walls 15a1, 15a2 around the lower cover 15 by a lock hook 15c.

Figure 4:
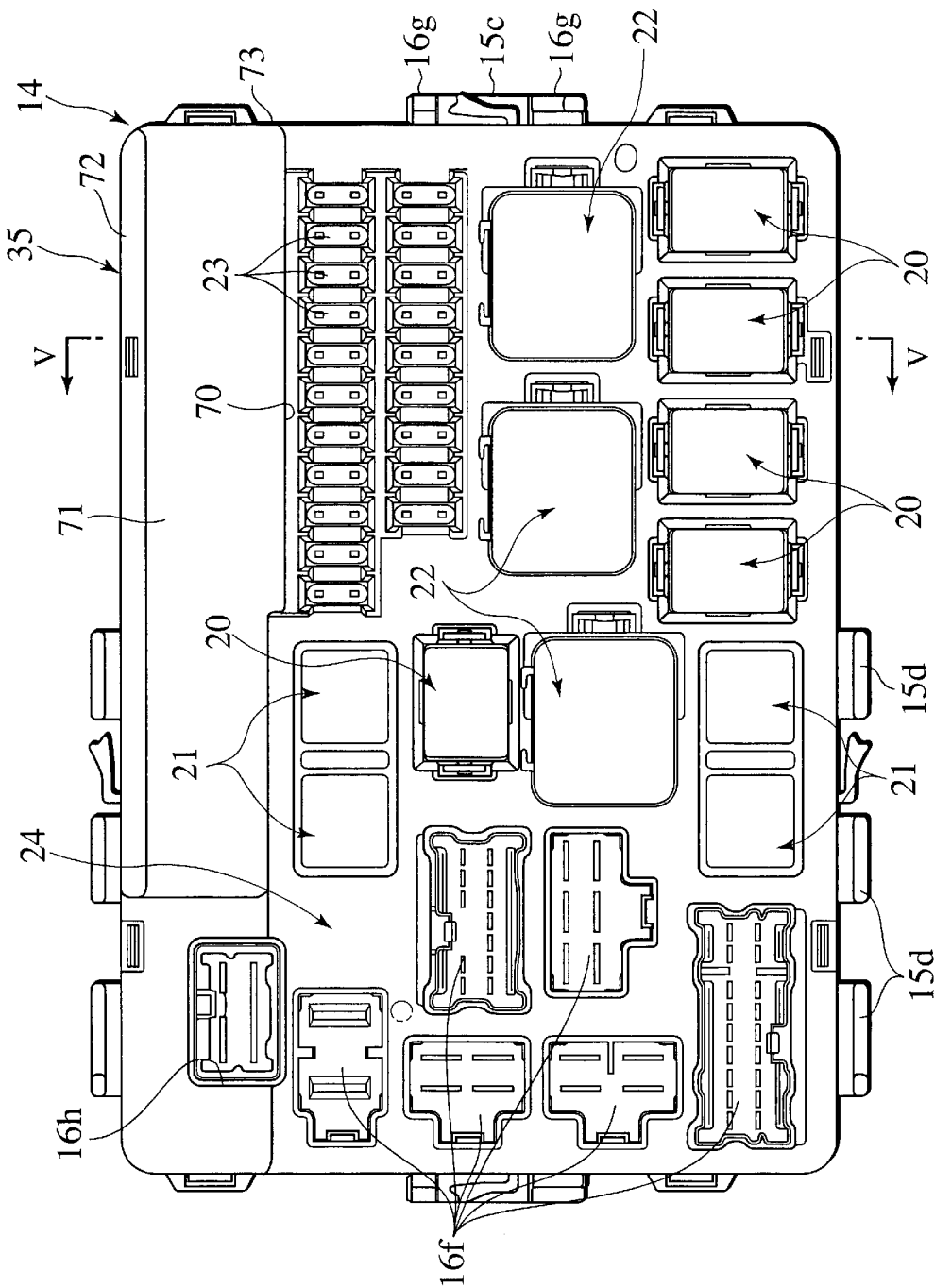
FIG. 4 is a front elevation view of the module.

The upper cover 16 includes mounting face 24 for various kinds of relays such as a micro relay 20, a half micro relay 21, a 2M relay 22 and the like which are outward attached, and outward attached electronic parts such as a fuse and the like are mounted thereto, as shown in FIGS. 2, 3 and 4. This mounting face 24 has insertion openings 16b, 16c and 16d for the various kinds of relays. The mounting face 24 has an insertion opening 16e for the fuse 23.

One half side (a left end portion in FIG. 4) of the upper cover 16 is provided with a plurality of connector insertion openings 16f for the removable inserting of mating connectors (not shown) in a combined manner.

Further, as shown in FIG. 2, the upper cover 16 and the lower cover 15 have both side walls 16a2 and 15a2 in a Y direction. First guide pieces 16g and 15c having an L-shaped cross section are integrally protruded from the side walls 16a2 and 15a2 respectively. Second pressing lock pieces 15d having an L-shaped cross section are integrally protruded from both side walls 15a1 in an X direction orthogonal to the side wall 15a2.

The mounting face 24 has a half side provided with bulge 35. The bulge receives control base board 19 fixed to board 17.

Figure 5:
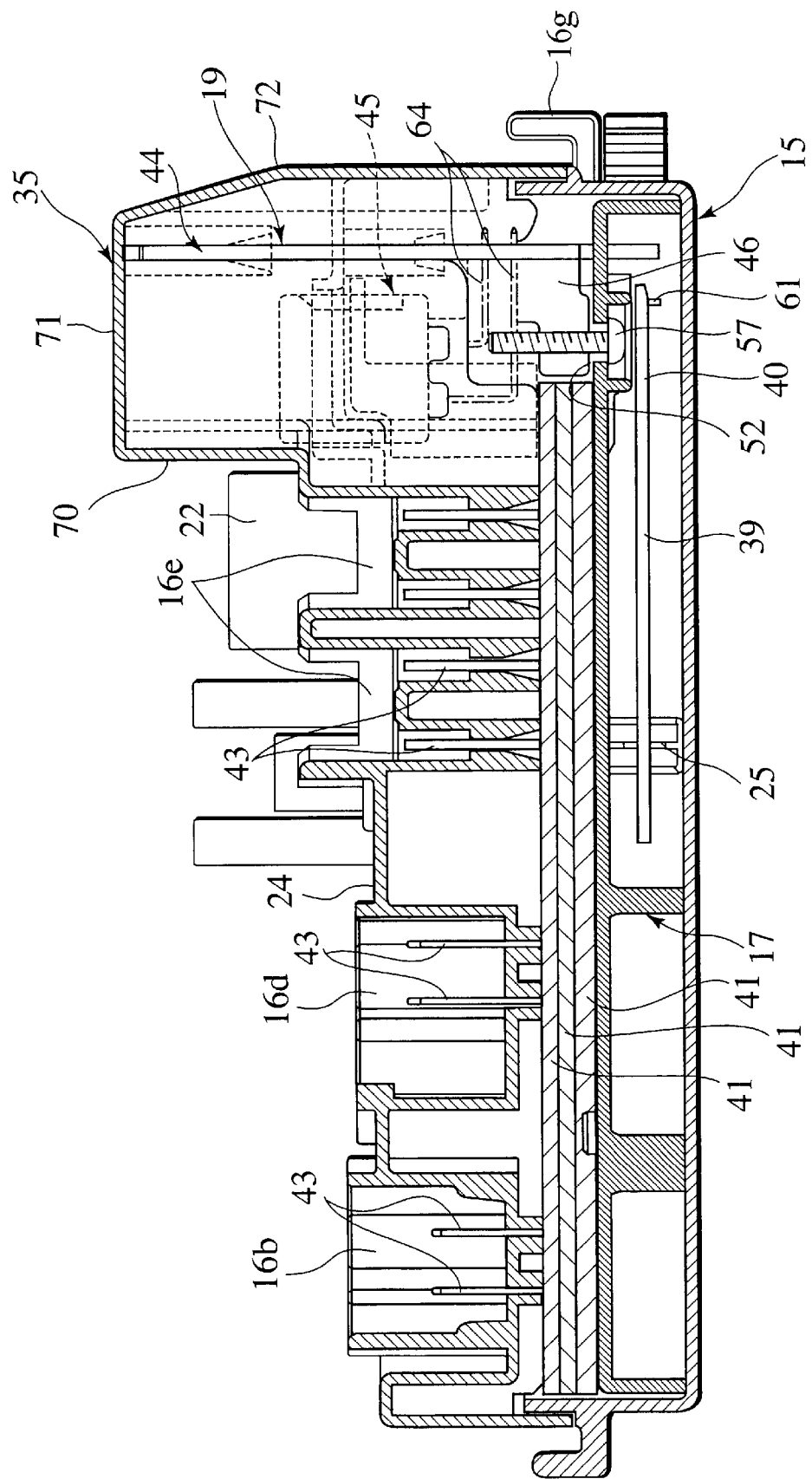
FIG. 5 is a cross sectional view of an inner portion of the module.
Figure 6:
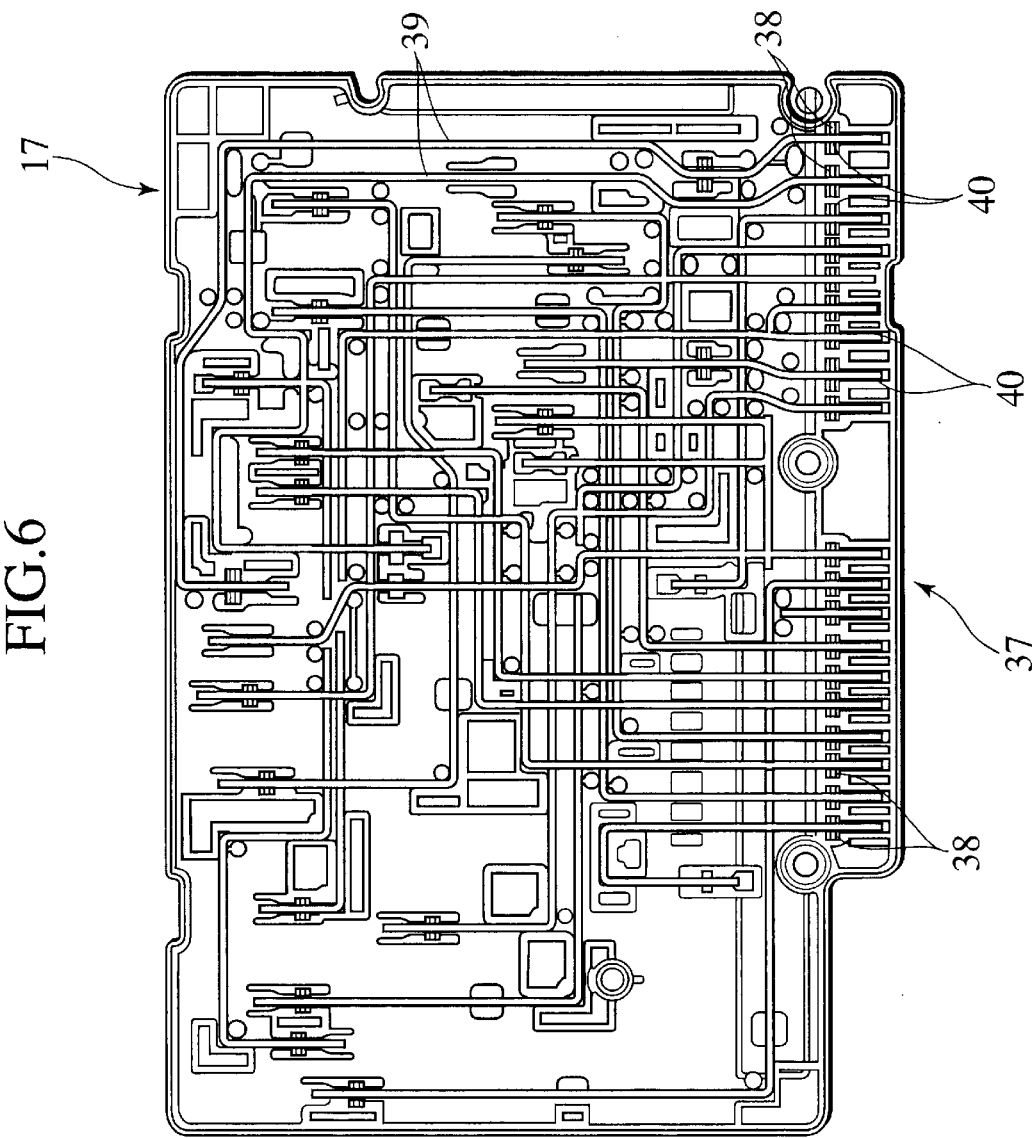
FIG. 6 is a plan view of a back surface side of a plane wiring board within the module.

The plane wiring board 17 is formed by a rectangular reverse-dish-shaped hard resin board as shown in FIG. 3. The board 17 has a top face, in which a lot of insertion openings for insulation displacing terminal 36 are formed. The board 17 has a side, and a base board fixing portion 37 is provided therein. A plurality of insertion openings for insulation displacing terminal 38 are also formed in the fixing portion 37 in one row along a side portion. The board 17 has a reverse side, in which a plurality of arrangement passages for arranging electric wires 39 are formed, as shown in FIGS. 5 and 6. The electric wires are arranged along the passages so as to constitute a circuit. Terminal portions 40 of the arranged electric wires 39 are arranged in the reverse side of the fixing portion 37, and respectively correspond to the openings 38. The board 17 is received within the lower cover 15 as shown in FIG. 5. The board 17 has a top side, on which wired boards 18a, 18b and 18c are piled.

The wired boards 18a, 18b and 18c have insulation boards 41, as shown in FIG. 3, and a predetermined circuit is formed thereon by respective bus bars 42. The wired board 18 has a lot of standing terminals 43, and they are connected to the respective circuits. The respective wired boards 18a, 18b and 18c are piled on each other. The terminals 43 in the lower wired board 18a pass through the wired boards 18b and 18c disposed above so as to protrude above of the upper wired board 18c. The terminal portions 43 of the middle wired board 18b pass through the upper wired board 18c so as to protrude out. An insulation displacing terminal 25 provided in a buss bar 42 of the lowermost wired board 18a and bent downward passes through the board 17 so as to be press contacted with and connected to the electric wire 39 which is arranged in the reverse side of the board 17. The control base board 19 is fixed onto the board 17 together with the wire board 18.

Figure 7:
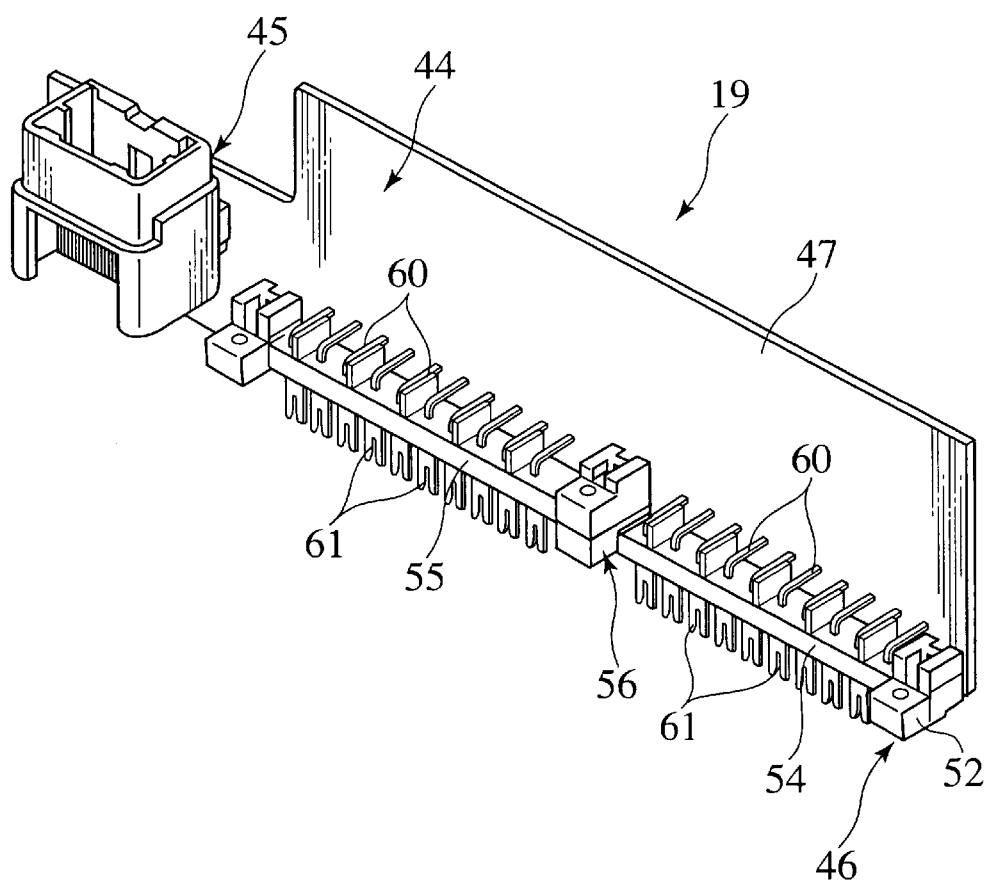
FIG. 7 is an enlarged perspective view of a basic structure from which various kinds of electronic parts of a control base board are removed.
Figure 8:
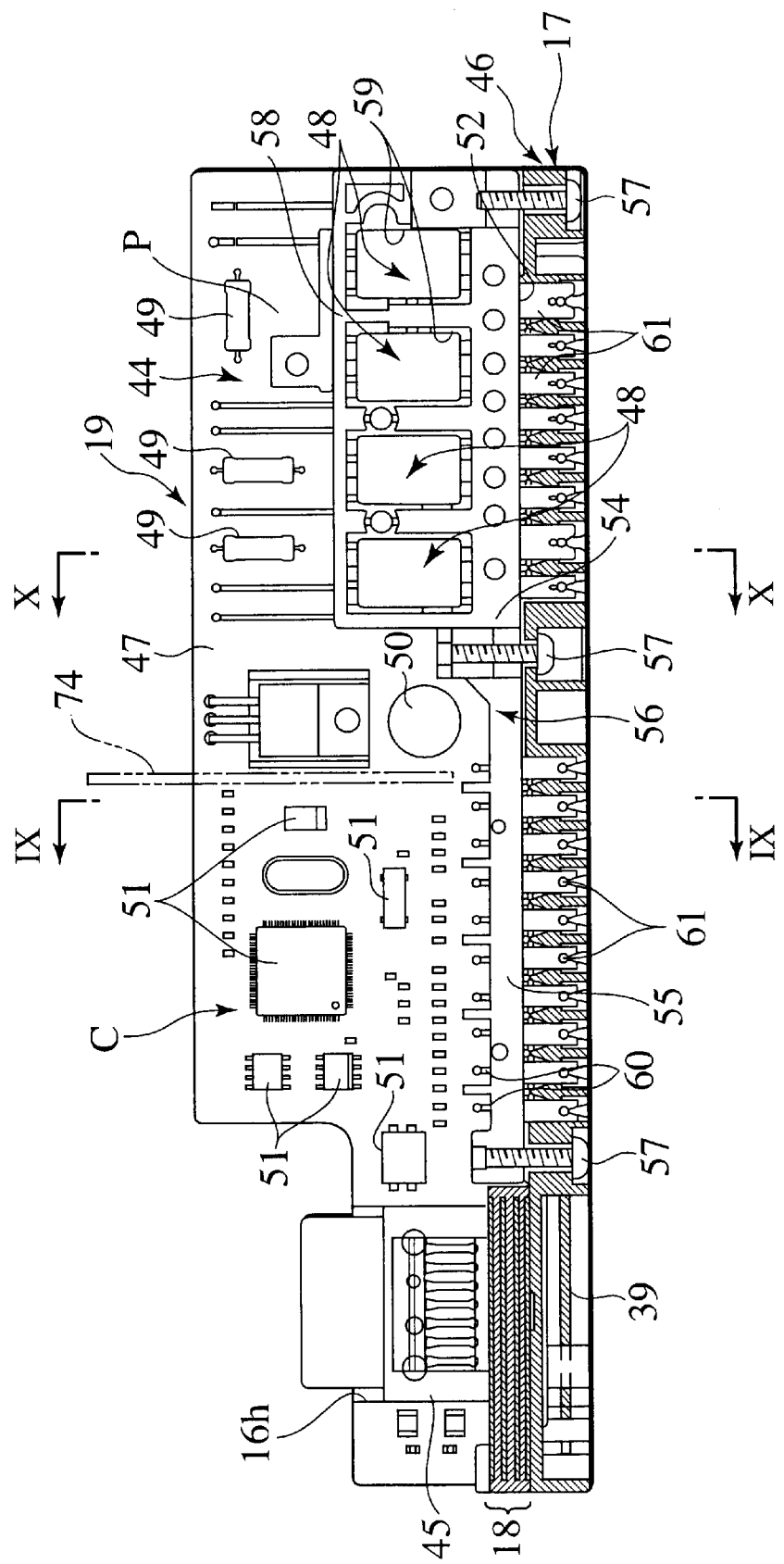
FIG. 8 is a front elevation view of the control base board.

The control base board 19 has a base board 44, as shown in FIGS. 7 and 8. The base board 19 has a base board connector 45 fixed to the base board 44. The base board 19 has a terminal block 46 for fixing the base board 44 onto the board 17. The base board 44 has an insulation board 47, and various kinds of electronic parts such as a relay 48, a resistor 49, a coil 50, a control device 51 and the like are mounted thereto. The insulation board 47 is provided with a base board connector 45 in an end portion in a longitudinal direction. The base board 44 is arranged on the board 17 so as to stand up. The base board 44 is mounted to the terminal block 46 substantially perpendicularly to a front surface (in a near side in the drawing) of the lower end portion thereof, as shown in FIG. 9.

The electronic parts have a power portion P constituted by the relay 48, the resistor 49 and the coil 50. The electronic parts have a control portion C constituted by a device 51 (for example, a microprocessor, ROM or RAM). As shown in FIG. 8, the power portion P having a large amount of generation heat is arranged in a half side (in a near side in FIG. 1) in a longitudinal direction of the insulation board 47 together. The control portion C having a small amount of generation heat is arranged in another half side in the longitudinal direction of the insulation board 47 together.

Figure 9:
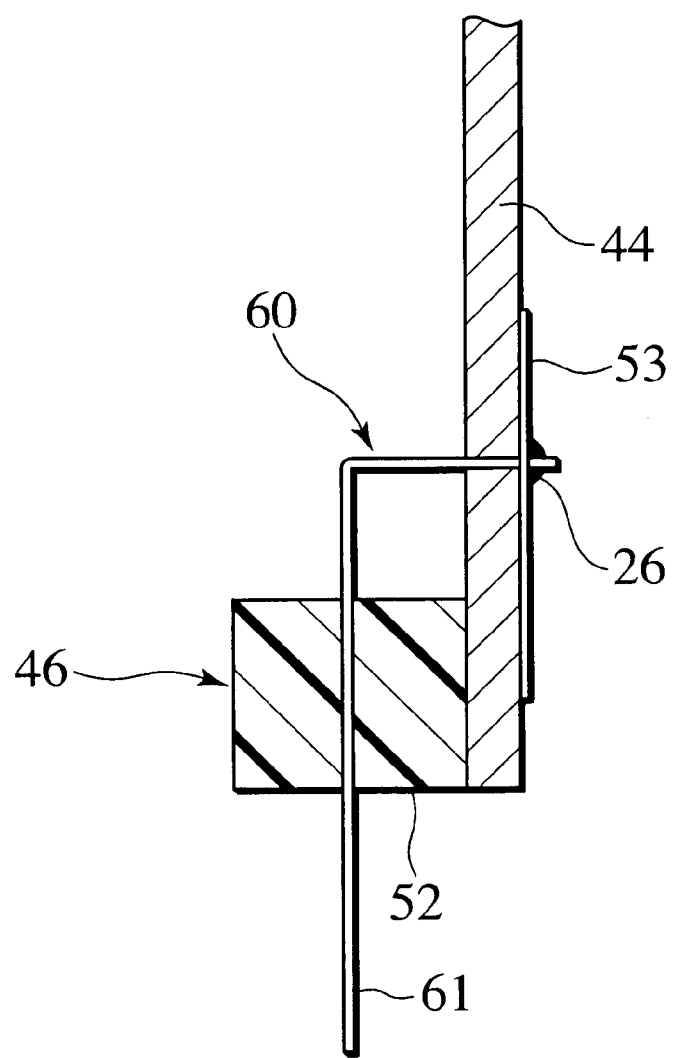
FIG. 9 is a sectional view taken along by cutting along a line IX—IX in FIG. 8.

The relay 48, the resistor 49 and the coil 50 in the power portion P, and the device 51 in the control portion C are connected by a narrow circuit pattern 53 (refer to FIG. 9). The circuit pattern 53 is structured such that a conductor is printed on the insulation board 47. A width of the print determines whether the circuit pattern 53 is thick or narrow. The board 47 is fixed to board fixing part 37 of board 17 by terminal block 46.

The terminal block 46, in FIGS. 7 and 8, is separated into two pieces in a substantially center portion in a longitudinal direction thereof, so as to constitute a first separation block 54 and a second separation block 55. End portions in the first and second separation blocks 54 and 55 which are adjacent to each other are piled on each other as shown in FIG. 7, so as to constitute a piled part 56. The both end portions and the piled part 56 are fastened to the board 17 by a screw 57 corresponding to a fastening member, as shown in FIG. 8, thereby fixing the terminal block 50. The screw 57 is inserted from the back surface of the board 17. The piled part 56 is fastened by one screw 57.

Figure 10:
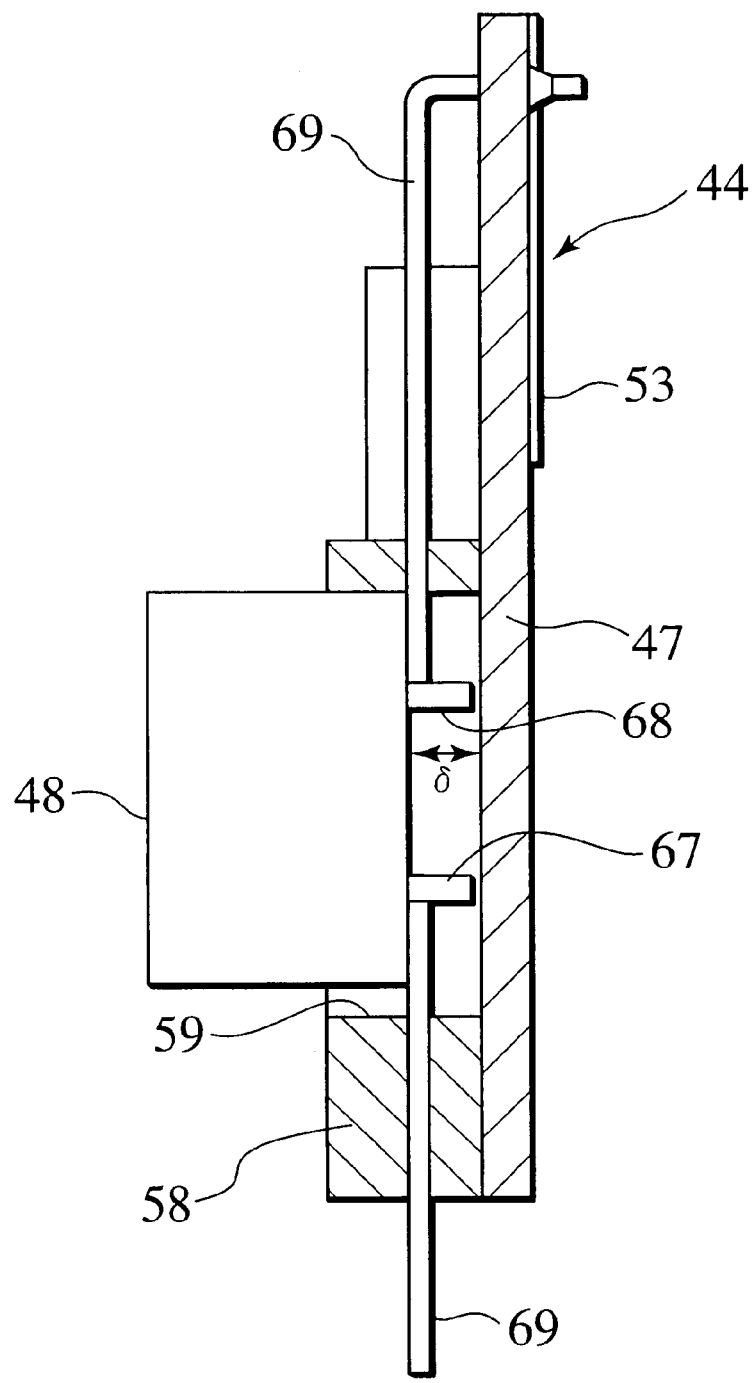
FIG. 10 is a sectional view taken along by cutting along a line X—X in FIG. 8.

The first separation block 54 has a vertical inner surface, and the relay holding board 58 is provided therein in parallel to the insulation board 47, as shown in FIG. 10. The holding board 58 has a window portion 59 in correspondence to the arrangement of the relay 48. By fitting the relay 48 to the window portion 59 50 as to retain, it is possible to stably retain the relay 48 which is apart from the insulation board 47.

A plurality of lead terminals 60 is integrally embedded in the terminal block 46, as shown in FIG. 9. The terminal 60 has a part, and an insulation displacing part 61 is formed therein. The terminal 60 has another part, and this has been bent toward the base board 44 so as to form an L shape. A front end of another side passes through the base board 44 so as to be connected to a circuit 53 of the base board 44 by means of a solder 26. When the terminal block 46 is fixed to the fixing portion 37, the insulation displacing part 61 is inserted into the board 17 from the opening 38 and is pressure contacted and connected to the terminal of the electric wire 39. In a state of fixing the terminal block 46 to the board 17, the terminal block 46 is substantially perpendicular to the insulation board 47. The base board 44 is perpendicularly mounted to the board 17. The base board 44 is fixed to the base board connector 45 in one side.

Figure 11:
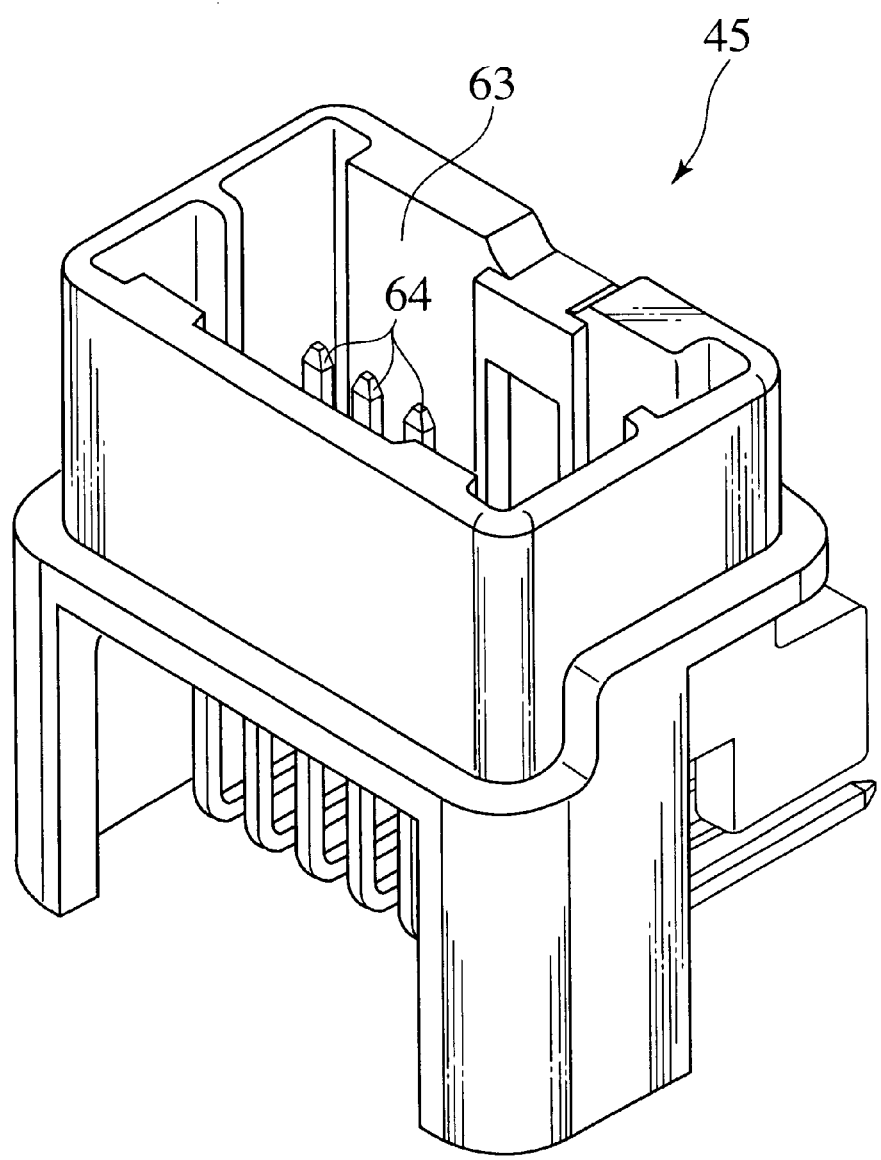
FIG. 11 is a perspective view of a base board connector mounted to the control base board.

The connector 45 is independently provided from the base board 44, as shown in FIGS. 7 and 11. The mating connector (not shown) is inserted to an insertion opening 63 thereof. The end of each of a plurality of terminals 64 protrudes within the insertion opening 63. This one end is connected to the mating connector. Another end of each of these terminals 64 protrudes to an outer portion corresponding to a lower side in the drawing of the insertion opening 63. A front end of another end is bent perpendicular to the base board 44.

Figure 12:
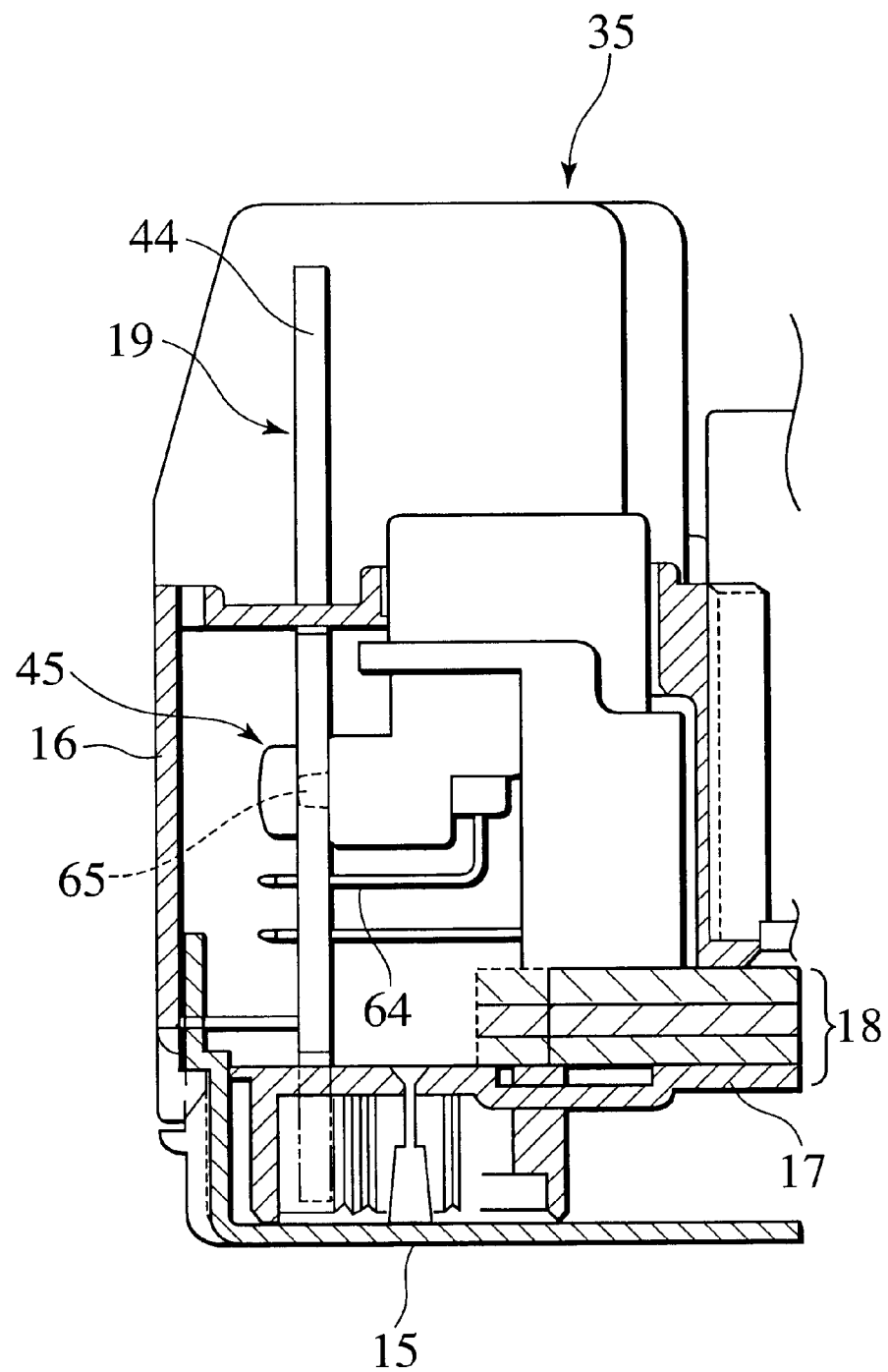
FIG. 12 is a sectional view taken along by cutting along a line XII—XII in FIG. 2.

The connector 45 has a projection 65 on a rear side, as shown in FIG. 12. The projection 65 is pressed into a fitting hole (not shown) formed in the insulation board 47 of the base board 44. According to this pressing, the front end of the terminal 64 is inserted to the base board 44 and is connected to a predetermined circuit pattern 53. At this time, the opening part of the insertion opening 63 of the connector 45 is faced outward from an opening 16h formed in the upper cover 16.

The relay 48 employs a mechanical type using an electromagnetic solenoid. The relay is structured such as to be turned on and off by the electromagnetic solenoid. This structure increases a produced heat of the solenoid. Accordingly, the relay 48 is supported to a relay holding board 58 mentioned below, as shown in FIG. 10. The relay 48 is mounted by a predetermined spacing δ apart from the insulation board 47 of the base board 44.

The relay 48 has power terminals 67 and 68, and they are respectively connected to lead terminals 69. At least one of lead terminals 69 extends from the relay 48 to the insulation board 47. The lead terminal 69 extends long and in parallel to the insulation board 47 therebetween. The extension exposes the lead terminal 69 on the insulation board 47. The exposed front end portion 69 is bent to the insulation board 47 and is fixed to the circuit pattern 53 by a solder. The exposed lead terminal 69 is provided with a heat radiating function.

The control base board body 19 fixed onto the plane wiring board 17, in a state in which the terminal block 46 and the base board connecter 45 are assembled in the base board 44 mentioned above, is received within a bulge 35 of the upper cover 16.

The upper cover 16 has the mounting face 24, as shown in FIGS. 2 and 3, and the control base board 19 is arranged in a half side (a far side part in FIGS. 1 and 2) thereof. This one half side forms the insertion openings 16b, 16c and 16d, various kinds of relays 20, 21 and 22, and a bulge 35. The relays 20, 21 and 22 are outward mounted to the insertion openings 16b, 16c and 16d. In the bulge 35, a protruding amount h becomes larger than that of the fuse 23. As shown in FIG. 12, the bulge 35 receives the control base board 44 in an inner side thereof.

The bulge 35 has a heat insulation wall 70 as shown in FIGS. 2 and 5. The wall 70 insulates thermally the base board 44 from the respective insertion openings 16b, 16c and 16d of the upper cover 16. The bulge 35 has a top wall 71 continuously provided from the wall 70. The bulge 35 has a rear wall 72 covering a back side of the control base board 44. The walls 70, 71 and 72 are formed so as to have a C-shaped cross section. As shown in FIG. 2, the bulge 35 has both ends, and they are closed by side walls 73.

Further, the control base board 44 has the power portion P and the control portion C, as shown in FIG. 8, and they are separately arranged. The bulge 35 has a heat insulation partition 74 in an inner side thereof as shown in FIG. 8, and this is inserted between the power portion P and the control portion C. The partition 74 thermally insulates the power portion P and the control portion C. The partition 74 is shown by a two-dotted chain line in FIG. 8.

Accordingly, in a state of receiving the base board 44 between the upper cover 16 and the lower cover 15, the bulge 35 covers an outer side of the base board 44. The partition 74 is inserted into a boundary between the portion having a great amount of generation heat and the portion having a small amount of generation heat in the base board 44. The above-constituted module 14, with upper case 13 and lower case 12 being housed in case 11, is mounted on a vehicle.

The case 11 has the upper case 13 and the lower case 12 constituting a pair, as shown in FIG. 1. A side wall 13a of the upper case 13 is mated to an outer peripheral surface of a side wall 12a of the lower case 12. A lock hook 13b of the upper case 13 is removably engaged with an engagement projection 12b of the lower case 12.

The upper case 13 and the lower case 12 define openings 13c and 12c respectively notched at positions corresponding to the connector insertion openings 16f and the base board connector 45. These openings 13c and 12c form one opening portion at a time of mating the upper case 13 and the lower case 12 with each other.

The openings 13c and 12c have a closing member 81 therebetween, and this is independent from the upper case 13 and the lower case 12. The closing member 81 closes a portion between the openings 13c and 12c at a time of mating the upper case 13 to the lower case 12. The closing member 81 has a lock hook 81a, and this is fixed removably to an engagement projection 12d of the lower case 12.

At this time, an upward-directed semi-cylinder portion 12e is formed in a lower part of the opening portion 12c. A downward-directed semi-cylinder portion 81b is formed in a lower part of the closing member 81. The semi-cylinder portions 12e and 81b are combined so as to form a cylindrical shape. The cylinder portion passes wire-harness of the mating connectors (not shown) to be connected to the connector insertion openings 16f and the base board connector 45 through in a lump. A mounting leg 12f is perpendicularly provided in the lower case 12 for the mounting to a vehicle.

At a time of receiving the module 14 in the case 11, the module 14 is at first received in the lower case 12 and the bulge 35 is arranged in the above, as shown in FIG. 1. The upper case 13 is mated to the outer peripheral surface of the lower case 12 from the above. According to this mating, the hook 13b and the projection 12b are engaged. The mating connector is connected to the connector openings 16f and the connector 45 in the module 14 from the openings 13c and 12c. The wire-harness is arranged between both of the semi-cylinder portions 81b and 12e, before the closing member 81 is arranged in the opening portion. The hook 81a is engaged with the projection 12d.

At a time of inserting the module 14 into the case 11 from the above so as to receive therein, the first guide pieces 16g and 15c of both of the side walls 15a2 and 16a2 in a Y direction (refer to FIG. 2) are engaged with engagement portions (not shown) in an inner side of the lower case 12. Front end surfaces of the first guides 16g and 15c resiliently abut against the inner side of the lower case 12. This abutment prevents the module 14 from loosening within the case 11.

Further, when case 11 receives module 14, the mounting face 24 of the upper cover 16 is arranged in a front surface 12g of the lower case 12. At this time, the insertion opening 16e of the mounting face 24 is positioned at a right half portion (shown by a two-dotted chain line in the drawing) of an upper end portion in the front surface 12g of the lower case 12. According to the present embodiment, the right half portion of the upper end portion is previously cut, and an opening 12h to which the insertion opening 16e is exposed is formed.

Next, a description will be given of an operation.

In the connection box 10 mentioned above, the base board 19 corresponding to the control portion is mounted to the board 17. The module 14 is structured by receiving the boards 17 and 19 between the upper cover 16 and the lower cover 15. The connection box 10 is structured by receiving the module 14 within the case 11 constituted by the upper case 13 and the lower case 12. The lower case 12 of the connection box 10 is mounted within an engine room of a vehicle (not shown) via the mounting leg 12f. The connection box 10 is collectively connected to wire-harness (not shown) of the various kinds of electrical equipment provided in the vehicle.

According to the connection box 10 of the present embodiment, the relay 48, the resistor 49, the coil 50 and the like which have a great amount of generation heat are arranged separately from the control device 51 having a small generation heat respectively in a lump. According to this arrangement, it is possible to connect the power portion P to the control portion C by a narrow circuit pattern 53.

The narrow circuit pattern 53 is arranged in compact by making an area of the base board 44 small. The circuit pattern 53 can reduce an influence of the heat in the power portion P to the control portion C so as to prevent a thermal damage on the control device 51. Accordingly, it is possible to prevent a false function of the control portion C and it is possible to stably execute an aimed control. A reliability of the connection box 10 is increased.

Further, since the power portion P having a great generation heat and the control portion C having a small generation heat are thermally insulated by a partition 74, it is possible to effectively insulate an influence of the heat generated in the power portion P to the control device 51. Accordingly, it is possible to further effectively prevent the thermal damage applied to the device 51 due to the heat generated in the power portion P.

A thermal insulation wall 70 thermally insulates the relay insertion ports 16*b*, 16*c* and 16*d* and the base board 44. The heat generated from the outward provided micro relays 20, 21 and 22 can be effectively insulated from the control device 51, without the influence on the device 51.

The entire contents of Japanese Patent Applications P2001-133327 (filed on Apr. 27, 2001) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A connection box comprising:
    a wiring board; and
    a control board connected to the wiring board, the control board including a control portion having at least one control device and a power portion having a plurality of other devices but no control device, the power portion being separate from the control portion and having generation heat greater than the control portion.

2. The connection box according to claim 1,
    wherein the at least one control device and said other devices are connected to each other by a narrow print wiring.

3. The connection box according to claim 1,
    wherein the control portion and the power portion have a partition therebetween for thermally insulating the control portion and the power portion.

4. The connection box according to claim 1, further comprising:
    a cover housing the control board, the cover including a port on outside thereof for mounting an electronic part and a wall between the at least one control device and the port.

5. The connection box according to claim 3, further comprising a cover housing the control board, the cover including the partition for thermally insulating the control portion and the power portion.

6. The connection box according to claim 1, wherein the control portion includes a plurality of control devices.

7. The connection box according to claim 1, wherein the control board is connected substantially perpendicular to the wiring board.

8. The connection box according to claim 7, further comprising a cover housing the control board, the cover including a bulge receiving at least a portion of the control board therewithin.

9. The connection box according to claim 1, wherein the control board includes an insulation board and a holding board provided parallel to the insulation board.

10. The connection box according to claim 9, wherein the holding board includes a window portion for fitting an electronic part.

11. The connection box according to claim 10, wherein the electronic part is fitted in the window portion of the holding board such that the electronic part is retained apart from the insulation board.

* * * * *